(12) United States Patent
Arai

(10) Patent No.: US 9,252,099 B2
(45) Date of Patent: Feb. 2, 2016

(54) SEMICONDUCTOR DEVICE HAVING MULTILAYER WIRING STRUCTURE AND MANUFACTURING METHOD OF THE SAME

(75) Inventor: Kazuyoshi Arai, Ome (JP)

(73) Assignee: TERA PROBE, INC., Yokohama, Kanagawa (JP)

( * ) Notice: Subject to any disclaimer, the term of this patent is extended or adjusted under 35 U.S.C. 154(b) by 1087 days.

(21) Appl. No.: 13/235,782

(22) Filed: Sep. 19, 2011

(65) Prior Publication Data

US 2012/0080788 A1  Apr. 5, 2012

(30) Foreign Application Priority Data

Sep. 30, 2010 (JP) ................. 2010-220481

(51) Int. Cl.
*H01L 23/48* (2006.01)
*H01L 23/522* (2006.01)
*H01L 23/31* (2006.01)
(Continued)

(52) U.S. Cl.
CPC .......... *H01L 23/522* (2013.01); *H01L 23/3114* (2013.01); *H01L 24/19* (2013.01); *H01L 24/20* (2013.01); *H01L 24/24* (2013.01); *H01L 24/82* (2013.01); *H01L 25/0657* (2013.01); *H01L 25/50* (2013.01); *H01L 24/13* (2013.01); *H01L 24/25* (2013.01); *H01L 24/73* (2013.01); *H01L 25/16* (2013.01); *H01L 2224/12105* (2013.01); *H01L 2224/13022* (2013.01); *H01L 2224/24146* (2013.01); *H01L 2224/32225* (2013.01); *H01L 2224/73267* (2013.01);
(Continued)

(58) Field of Classification Search
CPC ..................... H01L 2224/73265; H01L 24/19; H01L 23/5389; H01L 21/76877; H01L 2224/32145; H01L 2224/73204; H01L 2224/97; H01L 23/481; H01L 2224/82; H01L 2224/83; H01L 2224/12105; H01L 2224/13022; H01L 2224/24146; H01L 2224/32225; H01L 2224/73267; H01L 2225/06524; H01L 2225/06582; H01L 23/3114; H01L 23/522; H01L 24/13; H01L 24/20
USPC .......................... 438/618, 622–642, 107–109; 257/758–762, 774, 777, 795
See application file for complete search history.

(56) References Cited

U.S. PATENT DOCUMENTS 8,278,734 B2  10/2012 Mihara
2004/0070064 A1*  4/2004 Yamane et al. ............... 257/686
(Continued)

FOREIGN PATENT DOCUMENTS

CN  101847610 A  9/2010
JP  2001250836 A  9/2001
(Continued)

OTHER PUBLICATIONS

Chinese Office Action dated Dec. 2, 2013 (and English translation thereof) in counterpart Chinese Application No. 201110279467.0.
(Continued)

*Primary Examiner* — H Tsai
(74) *Attorney, Agent, or Firm* — Holtz, Holtz & Volek PC

(57) ABSTRACT

Disclosed is a semiconductor device 1 comprising: a semiconductor chip 10; a multilayer wiring structure 30 stacked on the semiconductor chip 10; and an electronic component 60,80 embedded in the multilayer wiring structure 30.

19 Claims, 12 Drawing Sheets

(51) Int. Cl.
- *H01L 25/065* (2006.01)
- *H01L 25/00* (2006.01)
- *H01L 25/16* (2006.01)
- *H01L 23/00* (2006.01)

(52) U.S. Cl.
CPC ........ *H01L 2225/06524* (2013.01); *H01L 2225/06582* (2013.01); *H01L 2924/01029* (2013.01)

(56) References Cited

U.S. PATENT DOCUMENTS

| | | |
|---|---|---|
| 2007/0158857 A1 | 7/2007 | Mihara |
| 2007/0284755 A1 | 12/2007 | Nomoto et al. |
| 2010/0290191 A1* | 11/2010 | Lin et al. ............ 361/704 |
| 2011/0291293 A1* | 12/2011 | Tuominen et al. ...... 257/774 |

FOREIGN PATENT DOCUMENTS

| | | |
|---|---|---|
| JP | 2005203614 A | 7/2005 |
| JP | 2006-310419 A | 11/2006 |
| JP | 2007-318060 A | 12/2007 |
| JP | 2008-047734 A | 2/2008 |
| JP | 2009-289863 A | 12/2009 |
| KR | 10-2007-0117986 A | 12/2007 |

OTHER PUBLICATIONS

Korean Office Action dated Nov. 9, 2012 (and English translation thereof) in counterpart Korean Application No. 10-2011-0093198.

Japanese Office Action dated May 13, 2014 (and English translation thereof) in counterpart Japanese Application No. 2010-220481.

Japanese Office Action dated Dec. 16, 2014, issued in counterpart Japanese Application No. 2010-220481.

* cited by examiner

SEMICONDUCTOR DEVICE HAVING MULTILAYER WIRING STRUCTURE AND MANUFACTURING METHOD OF THE SAME

CROSS-REFERENCE TO RELATED APPLICATIONS

This application is based upon and claims the benefit of priority from the prior Japanese Patent Application No. 2010-220481, filed on Sep. 30, 2010, the entire contents of which are incorporated herein by reference.

BACKGROUND OF THE INVENTION

1. Field of the Invention

The present invention relates to a semiconductor device having a multilayer wiring structure, and to a method for manufacturing the same.

2. Description of Related Art Japanese Patent Laid-Open Publication No. 2008-047734 describes a System In Package (SIP)-type semiconductor package (semiconductor device) in which a plurality of semiconductor chips are embedded. As described in No. 2008-047734, two insulating layers (6, 7) are stacked on a substrate (1) on which a circuit is not formed, wires (9, 13) are patterned on the individual insulating layers (6, 7), a bare chip (5) is embedded in the insulating layer (6) as a lower layer, further, a thick buffer layer (17) is stacked on the insulating layers (6, 7) as upper layers, and another bare chip (16) protected only by a silicon oxide film (16d) is embedded in the buffer layer (17).

In such a technology described in Japanese Patent Laid-Open Publication No. 2008-047734, the chips (5, 13) are embedded in the insulating layer (6) and the buffer layer (17), which are stacked on the substrate (1). Accordingly, the semiconductor package is thickened.

Moreover, the substrate (1) is a substrate obtained by cutting a wafer into pieces. After the chip (5) is mounted on the wafer, the wafer is finally cut. Accordingly, a size of the substrate (1) as the cut piece becomes larger than a size of the chip (5). Therefore, a size of the semiconductor package is enlarged.

SUMMARY OF THE INVENTION

In this connection, an object to be achieved by the present invention is to thin and miniaturize a semiconductor device such as the semiconductor package.

According to a first aspect of the present invention, there is provided a semiconductor device comprising:
a semiconductor chip;
a multilayer wiring structure stacked on the semiconductor chip; and
an electronic component embedded in the multilayer wiring structure.

According to a second aspect of the present invention, there is provided a method for manufacturing a semiconductor device, the method comprising:
stacking a multilayer wiring structure above a semiconductor wafer, and embedding an electronic component in the multilayer wiring structure; and
cutting the semiconductor wafer into pieces, and forming semiconductor chips.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DESCRIPTION OF THE PREFERRED EMBODIMENT

A description is made below of an embodiment of the present invention by using the drawings. Note that, on this embodiment to be described below, imposed are a variety of technically preferable limitations for carrying out the present invention; however, the scope of the present invention is not limited to the following embodiment and illustrated examples.

Figure 1:
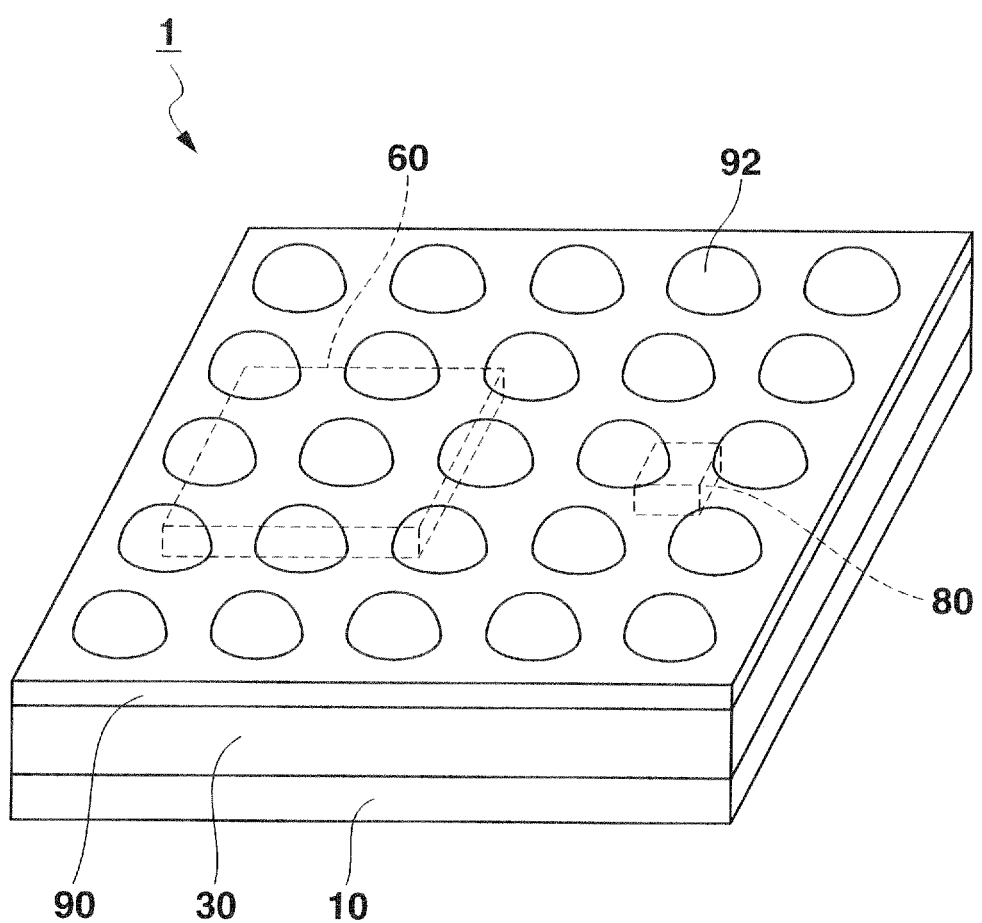
FIG. 1 is a perspective view of a semiconductor device according to an embodiment of the present invention.
Figure 2:
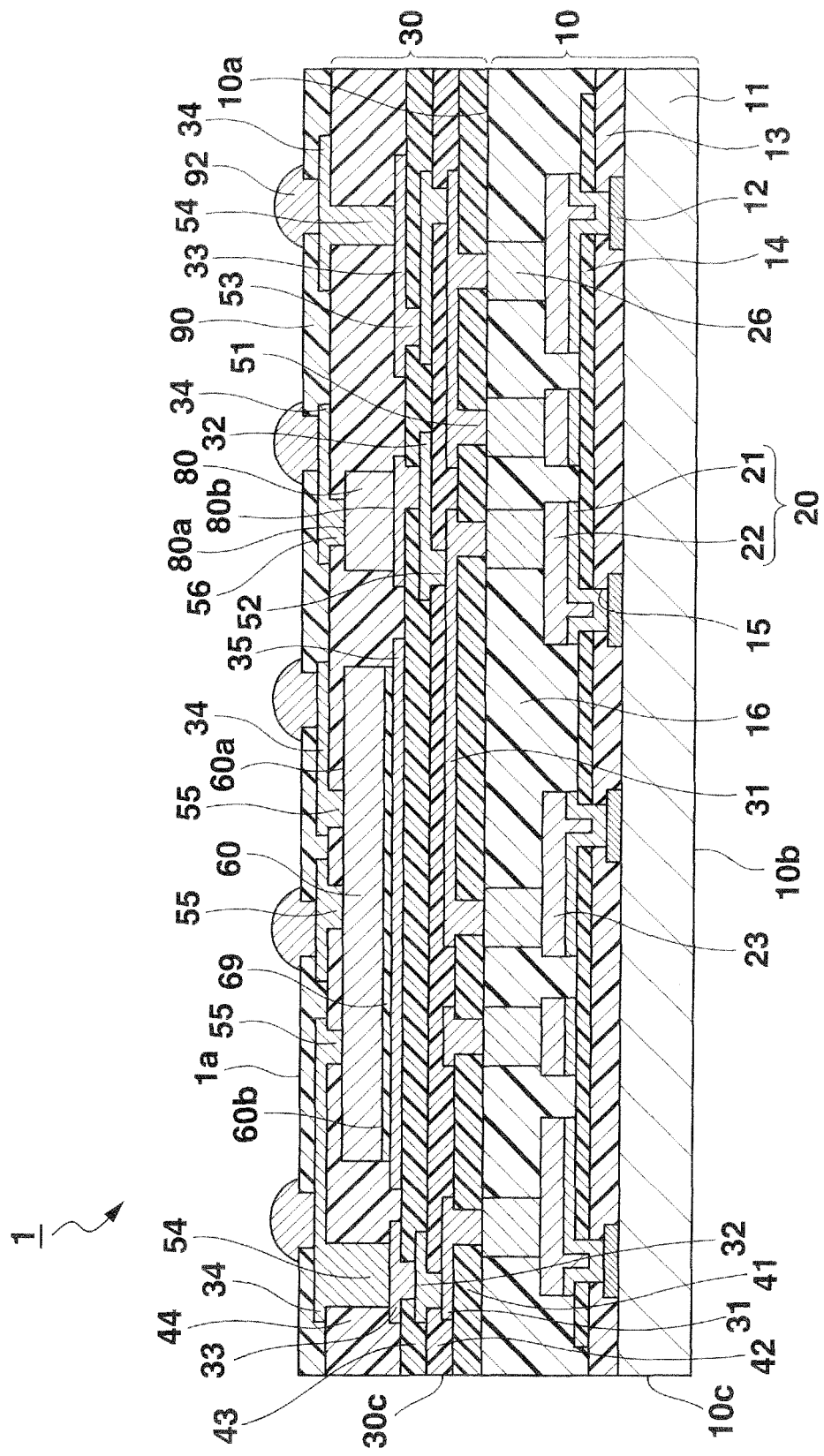
FIG. 2 is a cross-sectional view of the semiconductor device according to this embodiment.

FIG. 1 is a perspective view of a semiconductor device 1. FIG. 2 is a cross-sectional view of the semiconductor device 1.

As shown in FIG. 1 and FIG. 2, the semiconductor device 1 is a System In Package (SIM), which includes: a semiconductor chip 10; a multilayer wiring structure 30; electronic components 60 and 80; and the like. The multilayer wiring structure 30 is stacked on a front side surface 10a of the semiconductor chip 10, and electronic components 60 and 80 are embedded in the multilayer wiring structure 30.

Figure 3:
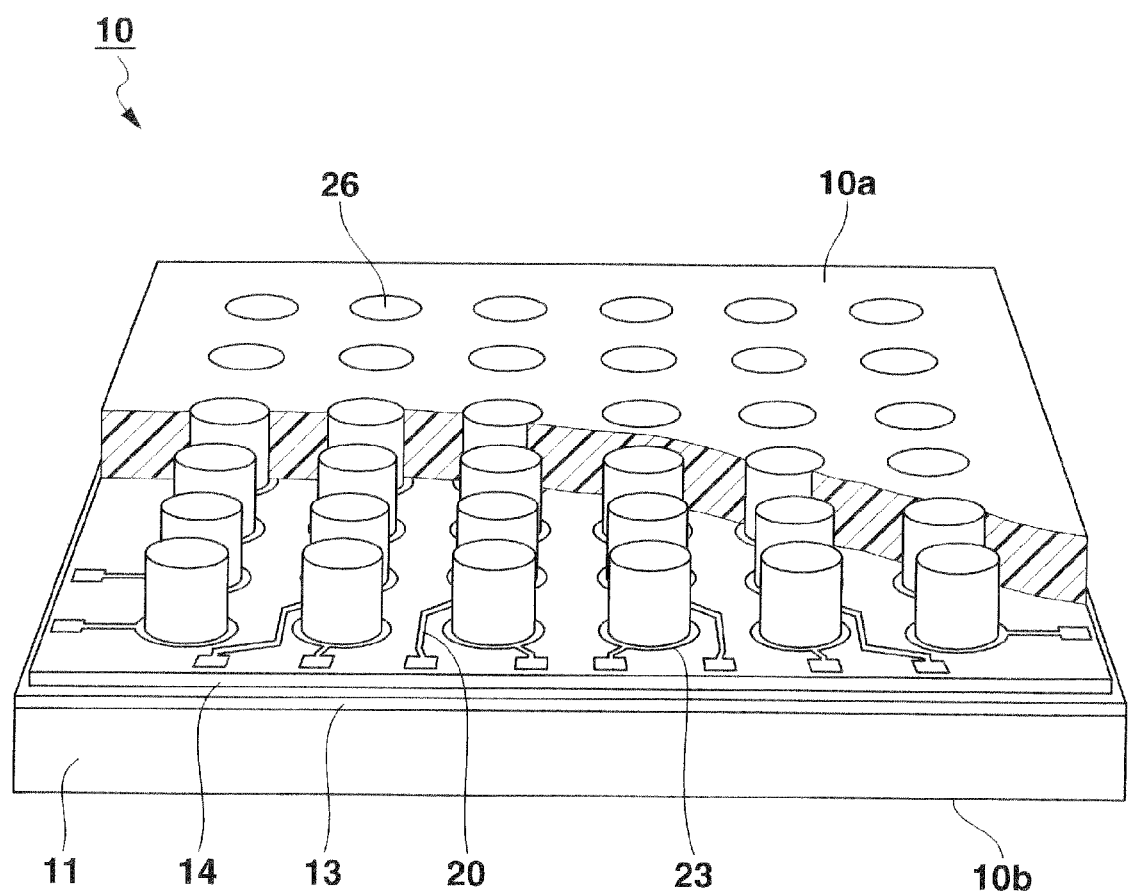
FIG. 3 is a perspective view showing a state where a semiconductor chip according to this embodiment is partially cut away.

First, by referring to FIG. 2 and FIG. 3, a description is made in detail of the semiconductor chip 10. FIG. 3 is a perspective view showing a state where a part of the semiconductor chip 10 is cut away. FIG. 3 shows a state where the multilayer wiring structure 30 is not stacked on the semiconductor chip 10.

The semiconductor chip 10 is a chip packaged to a chip size, and is a so-called Chip Size Package (CSP). In particular, this semiconductor chip 10 is manufactured in such a manner that, after a surface of a semiconductor wafer before being cut into pieces is sealed by resin, the semiconductor wafer concerned is cut into the pieces with the chip size. That is to say, among the CSP, the semiconductor chip 10 is particularly a Wafer Level Package (WLP).

The semiconductor chip 10 includes: a semiconductor substrate 11; a passivation film 13; an insulating film 14; a sealing layer 16; internal wires 20; outer terminals 26; and the like.

The semiconductor substrate 11 is made of a semiconductor material such as silicon, or the like. An integrated circuit is formed on a surface layer on a front side of the semiconductor substrate 11. A plurality of inner terminals 12 are formed on a front side surface of the semiconductor substrate 11. The inner terminals 12 are sometimes a part of wires of the integrated circuit formed on the surface layer of the semiconductor substrate 11, and are sometimes electrodes of a variety of electric elements (for example, diodes, transistors, resistors, capacitors and the like).

The front side surface of the semiconductor substrate 11 is coated with the passivation film 13. The passivation film 13 contains silicon oxide or silicon nitride. The passivation film 13 is coated with the insulating film 14. The insulating film 14 contains epoxy resin, polyimide resin or other resin. For example, for the insulating film 14, there can be used polyimide (PI), polybenzoxazole (PBO), an epoxy, phenol or silicon plastic material, composite materials of these, and the like.

In the passivation film 13 and the insulating film 14, at positions thereof overlapping the inner terminals 12, openings 15 are formed. A part or entirety of each of the inner terminals 12 is located in the opening 15, and is not covered with the passivation film 13 and the insulating film 14. Note that the insulating film 14 does not have to be formed.

The internal wires 20 are formed on the insulating film 14 (or on the passivation film 13 in the case where the insulating film 14 is not present). Each of the internal wires 20 is a stacked body of an underlying base 21 and a conductor layer 22. The underlying base 21 is formed on the insulating film 14 (or on the passivation film 13 in the case where the insulating film 14 is not present), and the conductor layer 22 is formed on the underlying base 21. The underlying base 21 is made of a conductor. For example, the underlying base 21 is a thin film of copper (Cu), a thin film of titanium (Ti), a thin film in which titanium is stacked on copper, or other metal thin films. The conductor layer 22 is a layer in which plating grown on a seed layer is patterned. The conductor layer 22 is made of copper or other metals. In the case of being viewed from above, a shape of the conductor layer 22 and a shape of the underlying base 21 are substantially the same. The conductor layer 22 is thicker than the underlying base 21. Note that each of the internal wires 20 does not have to be the stacked body of such conductors. For example, the internal wire 20 may be a single layer of the conductor, or a stacked body of more conductor layers.

Each of the internal wires 20 is connected to the inner terminal 12. Specifically, the internal wire 20 crosses over the opening 15, and a part of the underlying base 21 of the internal wire 20 is stacked on the inner terminal 12. The number of internal wires 20 may be larger than, smaller than or equal to the number of inner terminals 12. The number of inner terminals 12 connected to one internal wire 20 is one or two or more. Preferably, one inner terminal 12 is connected per one internal wire 20.

A part of each of the internal wires 20 becomes a land 23. On the land 23, an outer terminal 26 is formed, and the internal wire 20 is connected to the outer terminal 26. Therefore, the outer terminal 26 is conducted to the inner terminal 12 by the internal wire 20. The number of outer terminals 26 connected to one internal wire 20 is one or two or more. Preferably, one outer terminal 26 is connected per one internal wire 20. More preferably, one inner terminal 12 is conducted per one outer terminal 26 by the internal wire 20.

Each of the outer terminals 26 is a columnar electrode provided in a protruding shape. The outer terminal 26 is made of copper or other metals. A height (thickness) of the outer terminal 26 is larger than a thickness of the conductor layer 22. Note that, in FIG. 3, the outer terminals 26 are arrayed in a grid fashion with six rows and six columns; however, the array and number of outer terminals 26 are not limited to those.

The light-shielding sealing layer 16 is formed on the insulating film 14, and the internal wires 20 are covered with the sealing layer 16. Vertex surfaces of the outer terminals 26 are not covered with the sealing layer 16; however, circumferential surfaces of the outer terminals 26 are covered with and protected by the sealing layer 16. A surface of the sealing layer 16 is provided flush with the vertex surfaces of the outer terminals 26, or is located at a position slightly higher than the vertex surfaces of the outer terminals 26.

The sealing layer 16 contains epoxy resin, polyimide resin or other insulating resin, and preferably, is made of fiber-reinforced resin in which filler (for example, glass filler) is blended into the insulating resin (epoxy resin, polyimide resin or the like).

Note that the semiconductor chip 10 may be a package of a land grid array (LGA) mode. That is to say, the lands serving as terminals may be arrayed in a grid fashion on the front side surface 10*a* of the semiconductor chip 10.

A description is made of the multilayer wiring structure 30 with reference to FIG. 1 and FIG. 2.

The multilayer wiring structure 30 includes: wiring patterns 31 to 34; and insulating layers 41 to 44. The insulating layer 41, the insulating layer 42, the insulating layer 43 and the insulating layer 44 are stacked on the front side surface 10*a* of the semiconductor chip 10 in order of the insulating layer 41, the insulating layer 42, the insulating layer 43 and the insulating layer 44 from the semiconductor chip 10. The wiring pattern 31 is located between the insulating layer 41 and the insulating layer 42, the wiring pattern 32 is located between the insulating layer 42 and the insulating layer 43, the wiring pattern 33 is located between the insulating layer 43 and the insulating layer 44, and the wiring pattern 34 is formed on the insulating layer 44. The wiring pattern 31 and the wiring pattern 32 are isolated from each other by the insulating layer 42, the wiring pattern 32 and the wiring pattern 33 are isolated from each other by the insulating layer 43, and the wiring pattern 33 and the wiring pattern 34 are isolated from each other by the insulating layer 44.

Edges of the insulating layers 41 to 44 and side surfaces (peripheral surfaces) 10*c* of the semiconductor chip 10 are aligned with each other, and side surfaces (peripheral surfaces) 30*c* of the multilayer wiring structure 30 are aligned with the side surfaces 10*c* of the semiconductor chip 10.

A plurality of vias are opened in the insulating layer 44, interlayer connection conductors 54 are embedded in the vias, the interlayer connection conductors 54 penetrate the insulating layer 44, and by the interlayer connection conductor 54, the wiring pattern 34 and the wiring pattern 33 are conducted to each other. In a similar way, the wiring pattern 33 and the wiring pattern 32 are conducted to each other by an interlayer connection conductor 53 that penetrates the insulating layer 43, and the wiring pattern 32 and the wiring pattern 31 are conducted to each other by an interlayer connection conductor 52 that penetrates the insulating layer 42.

The interlayer connection conductor 54 and the wiring pattern 34 are formed integrally with each other, the interlayer connection conductor 53 and the wiring pattern 33 are formed integrally with each other, and the interlayer connection conductor 54 and the wiring pattern 32 are formed integrally with each other. These may be formed as separate bodies, and may be brought into contact with each other.

Moreover, in the insulating layer 41, a plurality of vias which reach the outer terminals 26 are opened, interlayer connection conductors 51 are embedded in the vias, the interlayer connection conductors 51 penetrate the insulating layer 41, and by the interlayer connection conductors 51, the wiring pattern 31 and the outer terminals 26 are conducted to each other.

The wiring patterns 31, 32, 33 and 34 and the interlayer connection conductors 51, 52, 53 and 54 are made of copper or other metals. The insulating layers 41, 42, 43 and 44 contain epoxy resin, polyimide resin or other insulating resins, and preferably, are made of glass fiber-reinforced epoxy resin, glass-cloth epoxy resin, carbon fiber-reinforced epoxy resin, carbon-cloth epoxy resin, glass fiber-reinforced polyimide resin, glass-cloth polyimide resin, carbon fiber-reinforced polyimide resin, carbon-cloth polyimide resin or other fiber-reinforced resins. Note that, in FIG. 2, the multilayer wiring structure 30 includes the four insulating layers 41, 42, 43 and 44 and the four wiring patterns 31, 32, 33 and 34; however, the number of insulating layers of the multilayer wiring structure 30 and the number of wiring patterns thereof just need to be two or more individually.

In the multilayer wiring structure 30 as described above, electronic components 60 and 80 are embedded. More specifically, the electronic components 60 and 80 are embedded in the insulating layer 44. The electronic component 60 is a semiconductor chip. The electronic component 60 may be a bare chip or may be a packaged semiconductor chip. In the case where the electronic component 60 is the packaged semiconductor chip, a package mode of the electronic component 60 is arbitrary.

Figure 4:
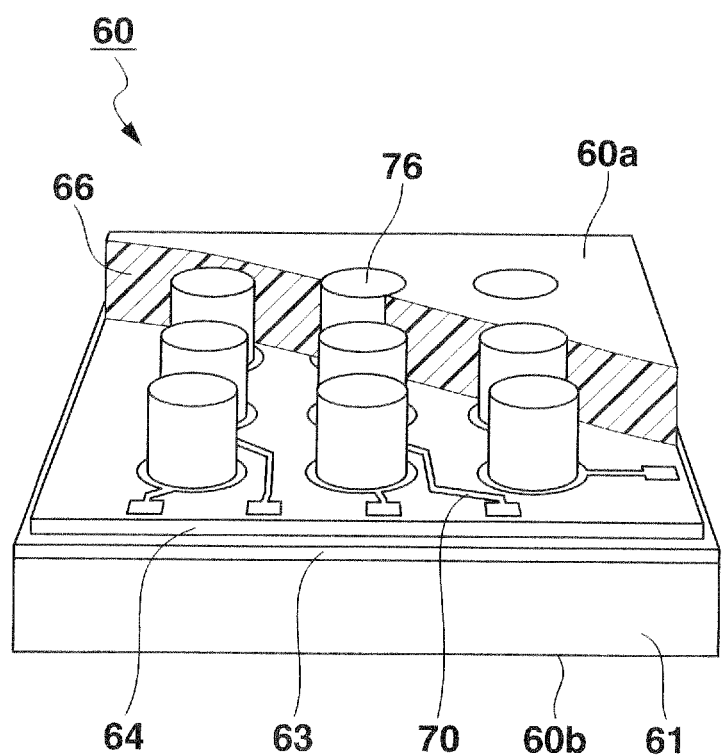
FIG. 4 is a perspective view showing a state where an electronic component according to this embodiment is partially cut away.

In the case where the electronic component 60 is particularly the WLP among the CSP, the electronic component 60 is configured as shown in FIG. 4. FIG. 4 is a perspective view showing a state where a part of the electronic component 60 is cut away. As shown in FIG. 4, the electronic component 60 includes: a semiconductor substrate 61; a passivation film 63; an insulating film 64; a sealing layer 66; internal wires 70; outer terminals 76; and the like. The electronic component 60 and the semiconductor chip 10 are different from each other only in terms of the number of outer terminals 76, the shape and position of the internal wires 70, the integrated circuit formed in the semiconductor substrate 61, and the like, and the electronic component 60 is a WLP in a similar way to the semiconductor chip 10. Accordingly, a detailed description of the electronic component 60 is omitted. A size of the electronic component 60 is smaller than the size of the semiconductor chip 10. Note that, in FIG. 4, the outer terminals 76 are arrayed in a grid fashion with three rows and three columns; however, the array and number of outer terminals 76 are not limited to those.

As shown in FIG. 2, the electronic component 60 is die-bonded on the insulating layer 43. Specifically, an underlying base 35 made of a conductor is formed on the insulating layer 43, an adhesive 69 is sandwiched between a back side surface 60b of the electronic component 60 and the underlying base 35, and the adhesive 69 is fixedly attached onto the back side surface 60b of the electronic component 60 and onto the underlying base 35. The underlying base 35 is a base patterned together with the wiring pattern 33. The underlying base 35 and the wiring pattern 33 are spaced from each other, and the underlying base 35 and the wiring pattern 33 are not conducted to each other. Note that the adhesive 69 may be directly and fixedly attached onto the insulating layer 43 without providing the underlying base 35.

The insulating layer 44 is deposited on the insulating layer 43 so as to cover the entirety of the electronic component 60, and the electronic component 60 is embedded in the insulating layer 44.

As shown in FIG. 4, terminals are not formed on the back side surface 60b of the electronic component 60, and on the front side surface 60a, vertex surfaces of the outer terminals 76 are exposed. Therefore, the outer terminals 76 are not connected to the wiring pattern 33. Meanwhile, as shown in FIG. 2, the plurality of vias are opened in the insulating layer 44, interlayer connection conductors 55 are embedded in the vias, the interlayer connection conductors 55 penetrate the insulating layer 44, and by the interlayer connection conductors 55, the wiring pattern 34 and the outer terminals 76 are conducted to each other.

Note that, in a state where the front side surface 60a of the electronic component 60 faces to the insulating layer 43, the electronic component 60 may be surface-mounted on the insulating layer 43 by a flip chip mode or the like. In this case, the underlying base 35 is not present, the wiring pattern 33 is patterned so as to reach under the electronic component 60, and the outer terminals 76 are conducted to the wiring pattern 33, for example, by solder, conductive paste, a conductive sheet, anisotropic conductive paste or an anisotropic conductive sheet. The outer terminals 76 are conducted to the wiring pattern 33, and accordingly, the interlayer connection conductors 55 are not present, and the vias in which the interlayer connection conductors 55 are embedded are not opened in the insulating layer 44, either.

The electronic component 80 is an active component (for example, a diode or a transistor) or a passive component (for example, a resistor or a capacitor). Moreover, the electronic component 80 is a chip resistor, a chip capacitor, a chip diode, a chip transistor or other surface-mounted chip components. Terminals are individually provided on a front side surface 80a and back side surface 80b of the electronic component 80. In a state where the back side surface 80b of the electronic component 80 faces to the insulating layer 43, the electronic component 80 is die-bonded onto the wiring pattern 33, and the terminal provided on the back side surface 80b is conducted to the wiring pattern 33.

The insulating layer 44 is deposited on the insulating layer 43 so as to cover the entirety of the electronic component 80, and the electronic component 80 is embedded in the insulating layer 44. A via is opened in the insulating layer 44, the interlayer connection conductor 56 is embedded in the via, the interlayer connection conductor 56 penetrates the insulating layer 44, and the terminal provided on the front side surface 80a of the electronic component 80 and the wiring pattern 34 are conducted to each other by the interlayer connection conductor 56.

The insulating layer 44 and the wiring pattern 34 are coated with an overcoat layer 90. A plurality of openings are formed in the overcoat layer 90, solder bumps 92 are formed in the openings, and the solder bumps 92 are fixedly attached to the wiring pattern 34. As shown in FIG. 1, the solder bumps 92 are arrayed in a grid fashion with five rows and five columns; however, the array and number of solder bumps 92 are not limited to those. Note that the solder bumps 92 do not have to be present.

As shown in FIG. 2, the electronic component 60 and the electronic component 80 are embedded in the same insulating layer 44. Accordingly, it is sufficient if only the insulating layer 44 is thickened, and the insulating layers 41, 42 and 43 do not have to be thickened. Therefore, thinning of the semiconductor device 1 can be achieved. Note that an insulating layer in which the electronic component 60 is embedded and an insulating layer in which the electronic component 80 is embedded may differ from each other. Moreover, the electronic components 60 and 80 may be embedded not in the insulating layer 44 but in the insulating layer 42 or the insulating layer 43. Even in the case where the number of insulating layers of the multilayer wiring structure 30 and the number of wiring patterns thereof is each other than four, the electronic components 60 and 80 just need to be embedded in the insulating layer other than the lowermost insulating layer.

The number of electronic components embedded in the multilayer wiring structure 30 is two; however, may be one, or three or more. In the case where the number of electronic components is two or more, preferably, all of the electronic components are embedded in the same insulating layer. This is in order to achieve the thinning of the semiconductor device 1 as mentioned above.

This semiconductor device 1 is used by being surface-mounted on a printed board. Specifically, a front side surface 1a of the semiconductor device 1, that is, a surface of the overcoat layer 90 is directed toward the printed board, the solder bumps 92 are brought into contact with terminals of the printed board, the semiconductor device 1 is mounted on the printed board, and the solder bumps 92 are re-flown. Then, the semiconductor device 1 is surface-mounted on the printed board.

The semiconductor device 1 may also be used as a circuit board. In the case where the semiconductor device 1 is used as the circuit board, the electronic components are surface-mounted on the overcoat layer 90, and the terminals of the electronic components concerned are bonded to the wiring pattern 34 by the solder bumps 92.

Note that the usage purpose of the semiconductor device 1 is not limited to the electronic components surface-mounted on the printed board, or to the circuit board on which the electronic components are surface-mounted.

As described above, the semiconductor chip 10 is not mounted on a board with a size larger than that thereof, and in addition, the electronic components 60 and 80 are embedded in the multilayer wiring structure 30 stacked on the semiconductor chip 10 concerned. Accordingly, the semiconductor device 1 can be formed to the chip size (size of the semiconductor chip 10). Therefore, the semiconductor device 1 can be miniaturized. Moreover, the multilayer wiring structure 30 is not stacked on the board serving as a base, but is stacked on the semiconductor chip 10. Accordingly, the semiconductor device 1 can be thinned by an amount of the board serving as the base.

Subsequently, a description is made of the method for manufacturing the semiconductor device 1.

Figure 5:
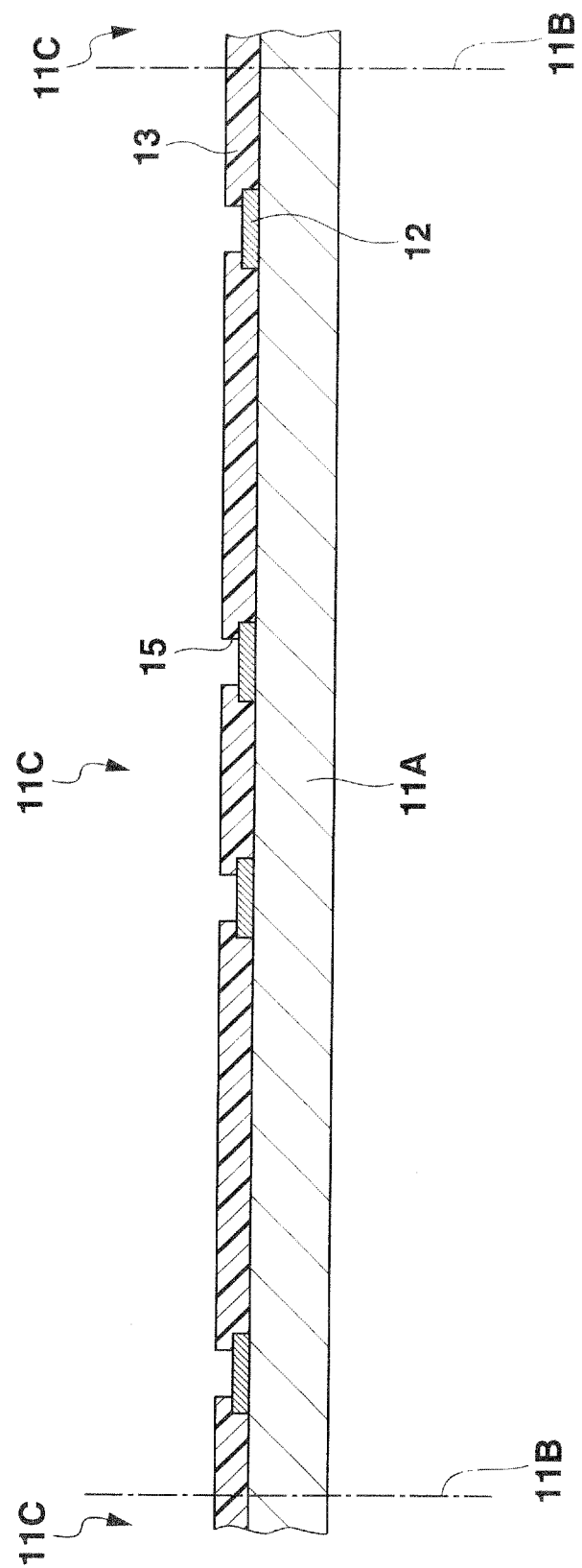
FIG. 5 is a cross-sectional view in one step of a method for manufacturing the semiconductor device according to this embodiment.

In the event of manufacturing the semiconductor device 1, a semiconductor wafer 11A (shown in FIG. 5) before being cut into pieces is used. As shown in FIG. 5, the semiconductor wafer 11A is partitioned into a plurality of chip regions 11C by a grid-like dicing street (boundary line) as a division schedule line. These chip regions 11C are arrayed in a matrix fashion. On a front-side surface layer of the semiconductor wafer 11A, integrated circuits are formed for each of the chip regions 11C. The plurality of inner terminals 12 are formed on the front side surface of the semiconductor wafer 11A. The passivation film 13 is deposited on the front side surface of the semiconductor wafer 11A. The openings 15 are formed in the passivation film 13, and the inner terminals 12 are exposed in the openings 15. On a back side surface of the semiconductor wafer 11A, a semiconductor (for example, silicon) is exposed.

Figure 6:
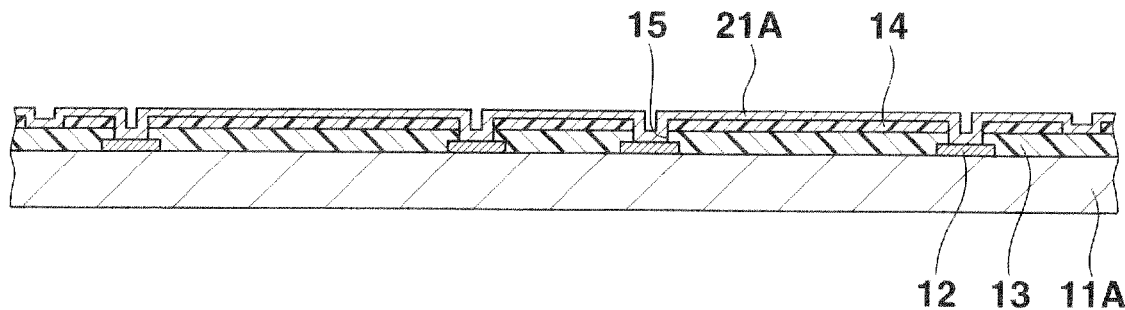
FIG. 6 is a cross-sectional view in a step after the step in FIG. 5.

As shown in FIG. 6, after the insulating film 14 is patterned on the passivation film 13, a seed layer 21A is deposited on the entirety of the insulating film 14 by an electroless plating method, or a vapor deposition method (for example, a sputtering method), or a combination of these. The seed layer 21A is grown also on inner wall surfaces of the openings 15 and on the inner terminals 12. In the event of patterning the insulating film 14, the insulating film 14 is partitioned for each of the chip regions 11C, and in addition, the openings 15 which communicate with the inner terminals 12 are formed in the insulating film 14. The seed layer 21A is a thin film of copper, a thin film of titanium (Ti), a thin film in which copper is stacked on titanium, or thin films of other metals. Note that the seed layer 21A may be formed on the passivation film 13 without forming the insulating film 14.

Figure 7:
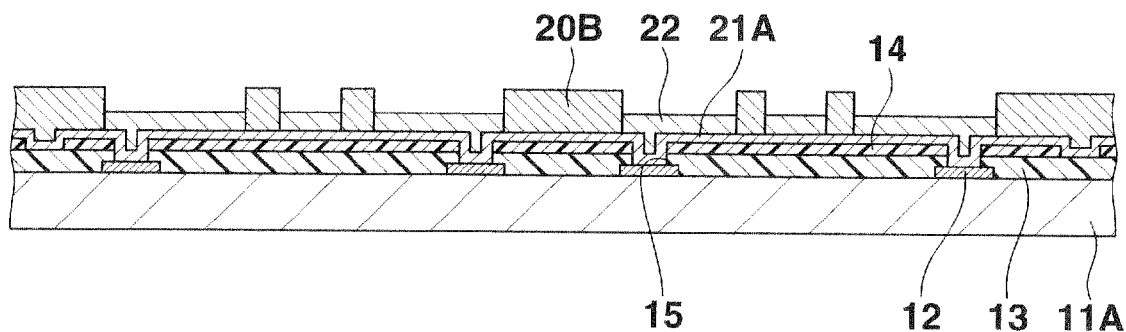
FIG. 7 is a cross-sectional view in a step after the step in FIG. 6.

Next, as shown in FIG. 7, the conductor layer 22 is patterned. Specifically, in a state where a mask 20B such as a resist is provided on the seed layer 21A, and the seed layer 21A is partially covered with the mask 20B, electroplating is performed by using the seed layer 21A as an electrode. On the mask 20B, slits matched with the position/shape of the conductor layer 22 to be formed are formed. By the electroplating, the conductor layer 22 is grown in the slits of the mask 20B, which are also on the seed layer 21A. The conductor layer 22 is grown to be thicker than the seed layer 21A. Note that, in the case where the mask 20B is the resist (for example, a dry film resist and a wet resist), the slits are formed on the mask 20B by exposure/development.

After the conductor layer 22 is formed, the mask 20B is removed.

Figure 8:
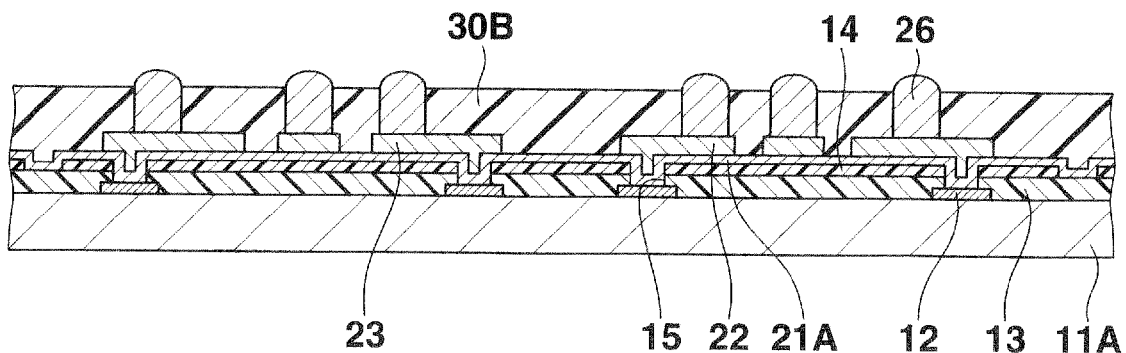
FIG. 8 is a cross-sectional view in a step after the step in FIG. 7.

Next, as shown in FIG. 8, the outer terminals 26 are patterned. Specifically, in a state where a thick mask (for example, a dry film resist) 30B is provided on the seed layer 21A and the conductor layer 22, and the seed layer 21A and the conductor layer 22 are partially covered with the mask 30B, electroplating is performed by using the seed layer 21A and the conductor layer 22 as electrodes. On the mask 30B, openings matched with the position/shape of the outer terminals 26 to be formed are formed. By the electroplating, the outer terminals 26 are grown in the openings, which are also on the conductor layer 22. Note that, in the case where the mask 30B is the dry film resist or the wet resist, the openings are formed on the mask 30B by exposure/development.

After the outer terminals 26 are formed, the mask 30B is removed.

Next, a portion in the seed layer 21A, which does not overlap the conductor layer 22, is removed by etching, whereby the seed layer 21A is processed into the underlying base 21 in terms of the shape. At this time, the surfaces of the conductor layer 22 and the outer terminals 26 are partially etched; however, since the conductor layer 22 and the outer terminals 26 are sufficiently thicker in comparison with the seed layer 21A, the conductor layer 22 and the outer terminal 26 remain.

Figure 9:
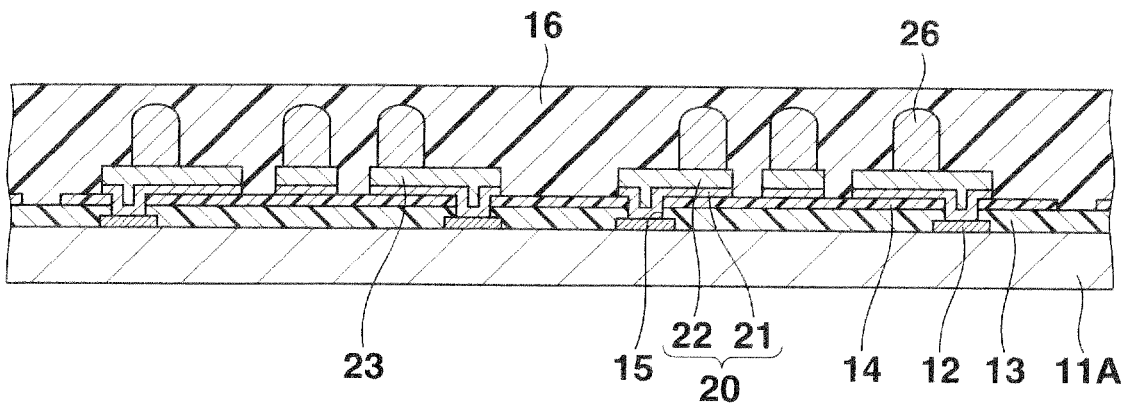
FIG. 9 is a cross-sectional view in a step after the step in FIG. 8.

Next, as shown in FIG. 9, the sealing layer 16 is formed on the insulating film 14 (or on the passivation film 13 in the case where the insulating film 14 is not present) by a printing method, a liquid droplet ejection method (an ink-jet method), a spin coating method, a dropping method or other applying methods. In the event of forming the sealing layer 16, the conductor layer 22 and the outer terminal 26 are covered with the sealing layer 16. Note that, in place of the application method, prepreg may be pasted onto the insulating film 14, and the prepreg may be cured, whereby the sealing layer 16 may be formed of the prepreg.

Figure 10:
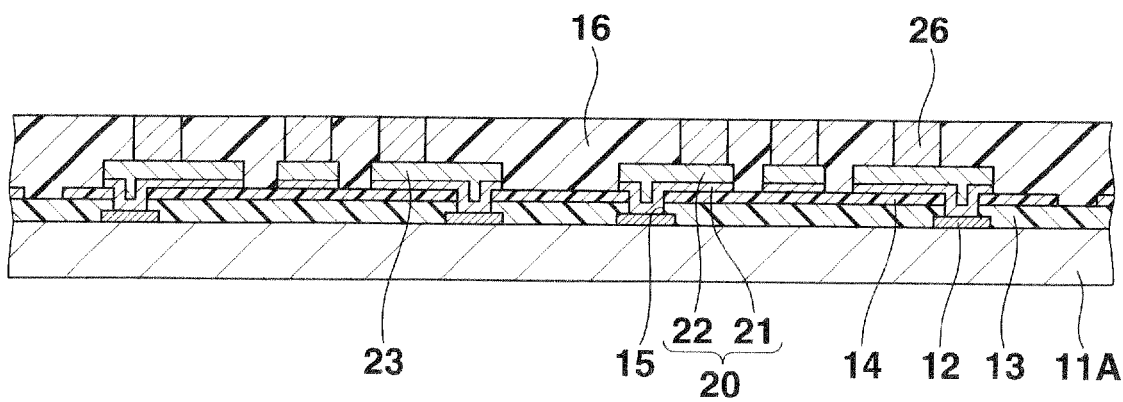
FIG. 10 is a cross-sectional view in a step after the step in FIG. 9.

Next, as shown in FIG. 10, the surface of the sealing layer 16 is ground, whereby the vertex surfaces of the outer terminals 26 are exposed.

By the steps described by using FIG. 5 to FIG. 10, the semiconductor chip 10 is manufactured up to a state before being cut into pieces. In the case where the electronic component 60 is the WLP, in order to fabricate the electronic component 60, steps similar to the steps described by using FIG. 5 to FIG. 10 are performed, and thereafter, such a cut-in-piece process as a dicing process is performed. In such a way, a plurality of the electronic components 60 can be fabricated of one wafer.

Figure 11:
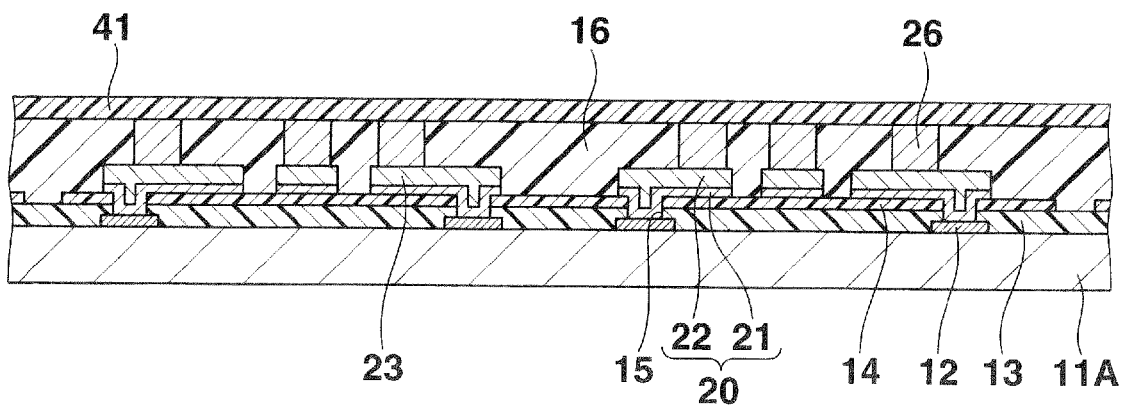
FIG. 11 is a cross-sectional view in a step after the step in FIG. 10.

After the outer terminals 26 are exposed, the prepreg is heat-pressed against the sealing layer 16 and the outer terminals 26 as shown in FIG. 11, whereby the insulating layer 41 is formed of the prepreg concerned. As the prepreg, preferably used are semi-cured ones of glass fiber-reinforced epoxy resin, glass-cloth epoxy resin, carbon fiber-reinforced epoxy resin, carbon-cloth epoxy resin, glass fiber-reinforced polyimide resin, glass-cloth polyimide resin, carbon fiber-reinforced polyimide resin, carbon-cloth polyimide resin or other fiber-reinforced resins. Note that the insulating layer 41 may be deposited by the printing method, the liquid droplet ejection method (the ink-jet method), the spin coating method, the dropping method or the other applying methods.

Figure 12:
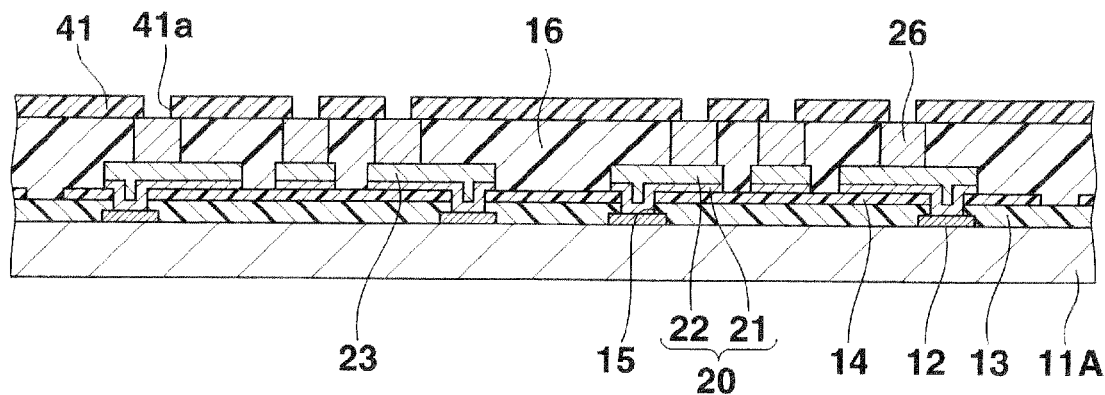
FIG. 12 is a cross-sectional view in a step after the step in FIG. 11.

Next, as shown in FIG. 12, a plurality of vias 41a are formed in the insulating layer 41. Formation spots of the vias 41a are located at positions overlapping the outer terminals 26, and the vias 41 are allowed to penetrate the insulating layer 41 until reaching the outer terminals 26. A method for forming the vias 41a may be a method of irradiating a laser beam onto the insulating layer 41, or a method of etching the insulating layer 41 in a state where a mask (for example, a metal mask, a photoresist, a dry film resist) is provided on the insulating layer 41.

Figure 13:
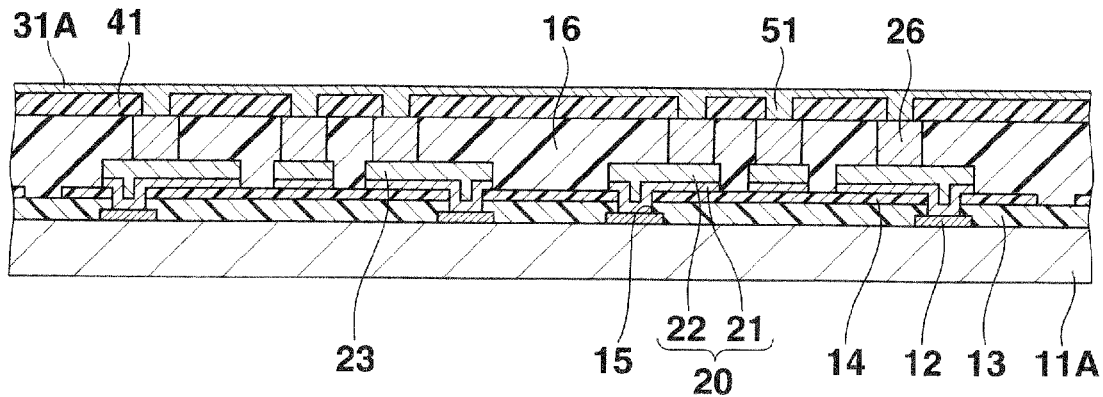
FIG. 13 is a cross-sectional view in a step after the step in FIG. 12.

Next, as shown in FIG. 13, the interlayer connection conductors 51 are grown in the vias 41a by the plating method, and in addition, a conductor film 31A is grown on the insulating layer 41. Note that a method for forming the interlayer connection conductors 51 is not limited to the plating method, and may be a method of embedding a conductive material (for example, conductive paste) in the vias 41a.

Figure 14:
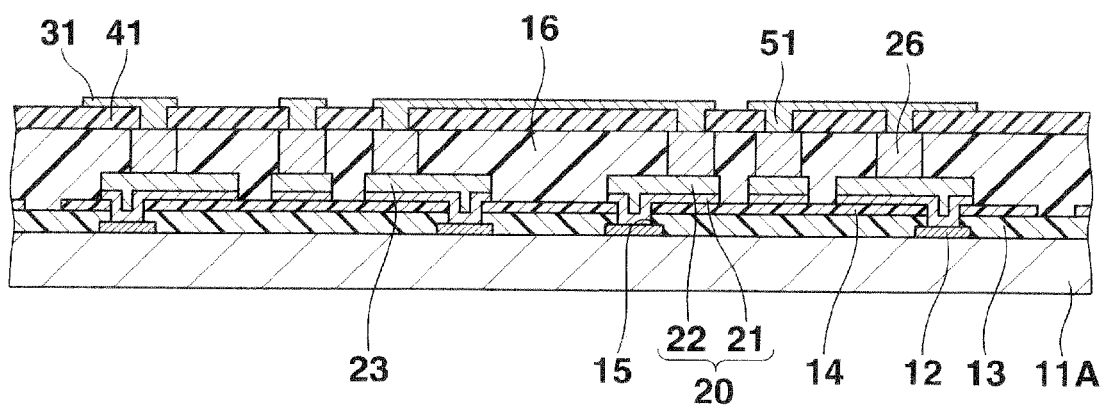
FIG. 14 is a cross-sectional view in a step after the step in FIG. 13.

Next, as shown in FIG. 14, the conductor film 31A is etched in a state where a mask (not shown) is provided on the conductor film 31A, whereby a part of the conductor film 31A is removed. In such a way, the wiring pattern 31 is fabricated of the conductor film 31A. The mask is removed after the wiring pattern 31 is formed. Note that the method for forming the wiring pattern 31 is not limited to such a subtraction method as shown in FIG. 13 and FIG. 14, and may be an additive method (a semi-additive method, a full-additive method or other additive methods).

Figure 15:
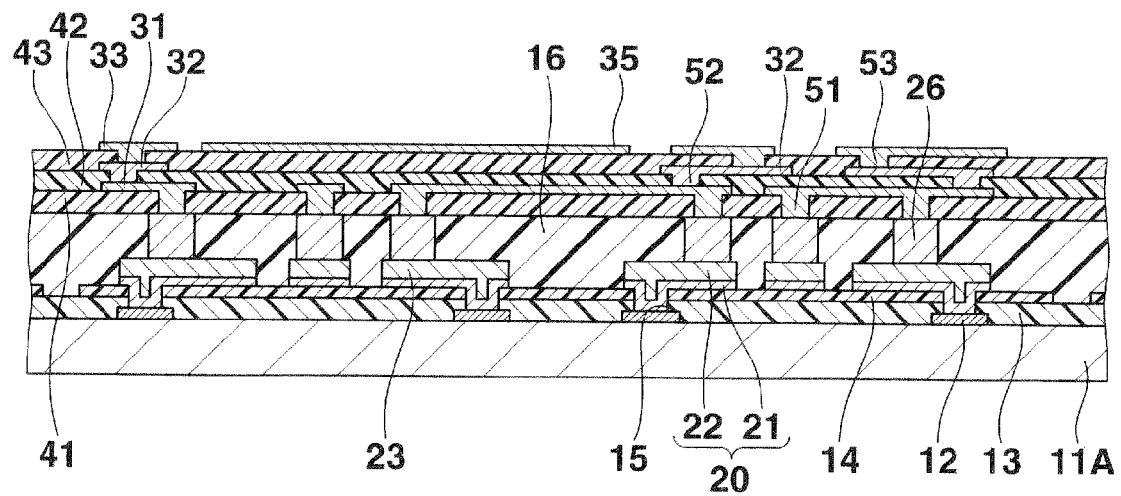
FIG. 15 is a cross-sectional view in a step after the step in FIG. 14.

In a similar way thereafter, the insulating layer 42, the interlayer connection conductors 52, the wiring pattern 32, the insulating layer 43, the interlayer connection conductors 53 and the wiring pattern 33 are sequentially formed (refer to FIG. 15). In the event of forming the wiring pattern 33, the underlying base 35 is also patterned. Note that the underlying base 35 does not have to be formed.

Figure 16:
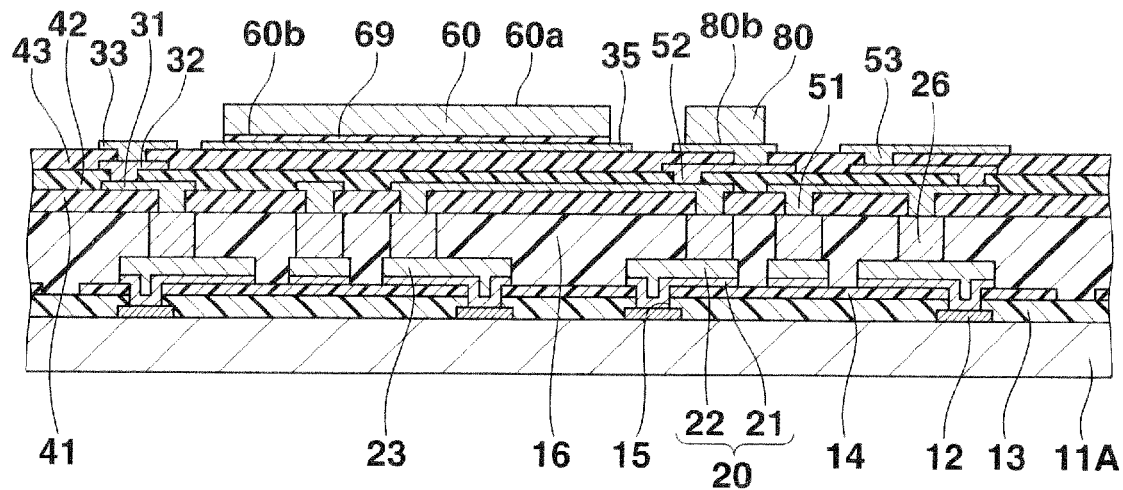
FIG. 16 is a cross-sectional view in a step after the step in FIG. 15.

Next, as shown in FIG. 16, the electronic component 60 is die-bonded onto the insulating layer 42, and the electronic component 80 is die-bonded onto the wiring pattern 33. With regard to the electronic component 60, the surface 60b thereof on which no terminals are present is directed downward, and the surface 60b concerned is adhered to the underlying base 35 (or onto the insulating layer 43 in the case where the underlying base 35 is not present). With regard to the electronic component 80, one side surface 80b thereof is directed downward, and the terminals formed on the surface 80b concerned are bonded to the wiring pattern 33 by, for example, solder, a conductive adhesive or the like. Note that, with regard to the electronic component 60, the surface 60a thereof on which the terminals are present may be directed downward, and the electronic component 60 may be flip-flop mounted on the wiring pattern 33 and the insulating layer 42. In this case, the terminals (for example, the outer terminals 76) formed on the surface 60a are bonded to the wiring pattern 33 by solder, a conductive adhesive or the like, whereby the terminals and the wiring pattern 33 are conducted to each other.

Figure 17:
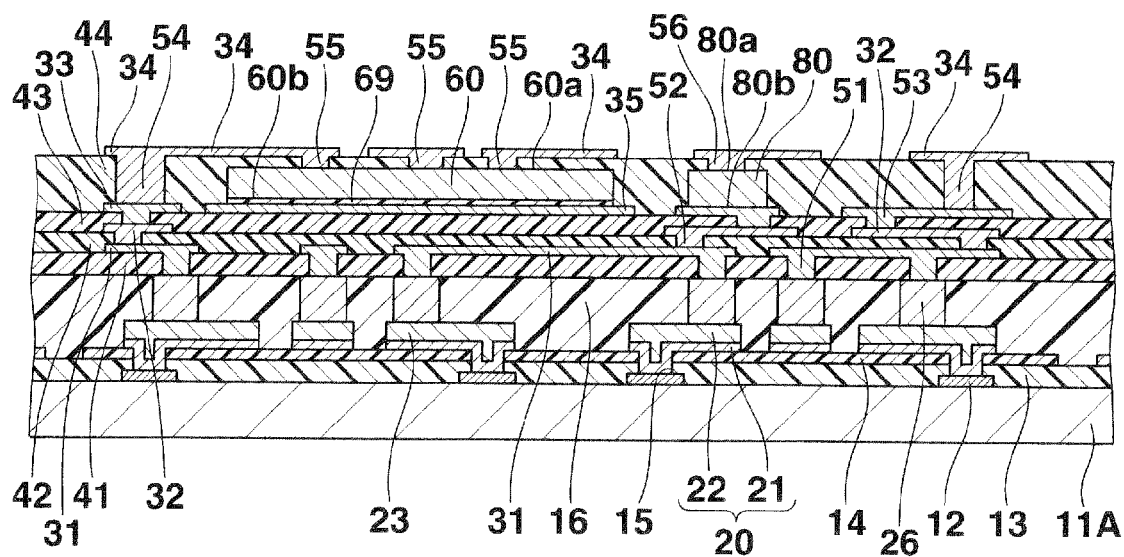
FIG. 17 is a cross-sectional view in a step after the step in FIG. 16.

Next, as shown in FIG. 17, the insulating layer 44 is deposited on the insulating layer 43 and the wiring pattern 33 so as to cover the electronic components 60 and 80 with the insulating layer 44. Then, after the plurality of vias are formed in the insulating layer 44, the interlayer connection conductors 54, 55 and 56 are individually formed in the vias, and in addition, the wiring pattern 34 is formed. Methods for forming the insulating layer 44, the interlayer connection conductors 54, 55 and 56 and the wiring pattern 34 are similar to the methods for forming the insulating layer 41, the interlayer connection conductors 51 and the wiring pattern 31. Note that, in the case where the terminals (for example, the outer terminals 76) of the electronic component 60 are connected to the wiring pattern 33, the interlayer connection conductors 55 and the vias served therefor are not formed.

Figure 18:
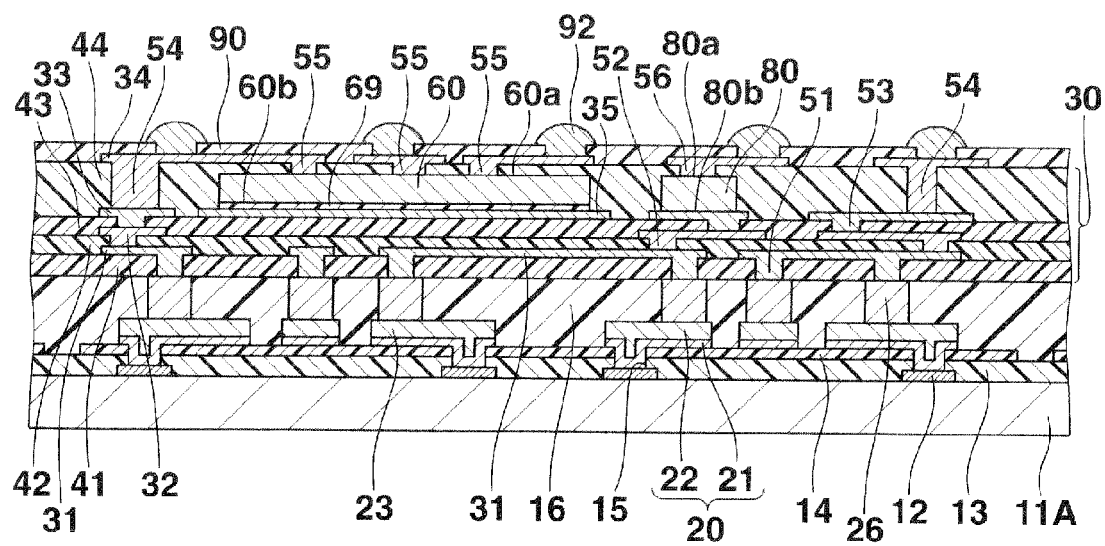
FIG. 18 is a cross-sectional view in a step after the step in FIG. 17.

Next, as shown in FIG. 18, after the overcoat layer 90 is patterned, the solder bumps 92 are formed in the openings formed in the overcoat layer 90.

Figure 19:
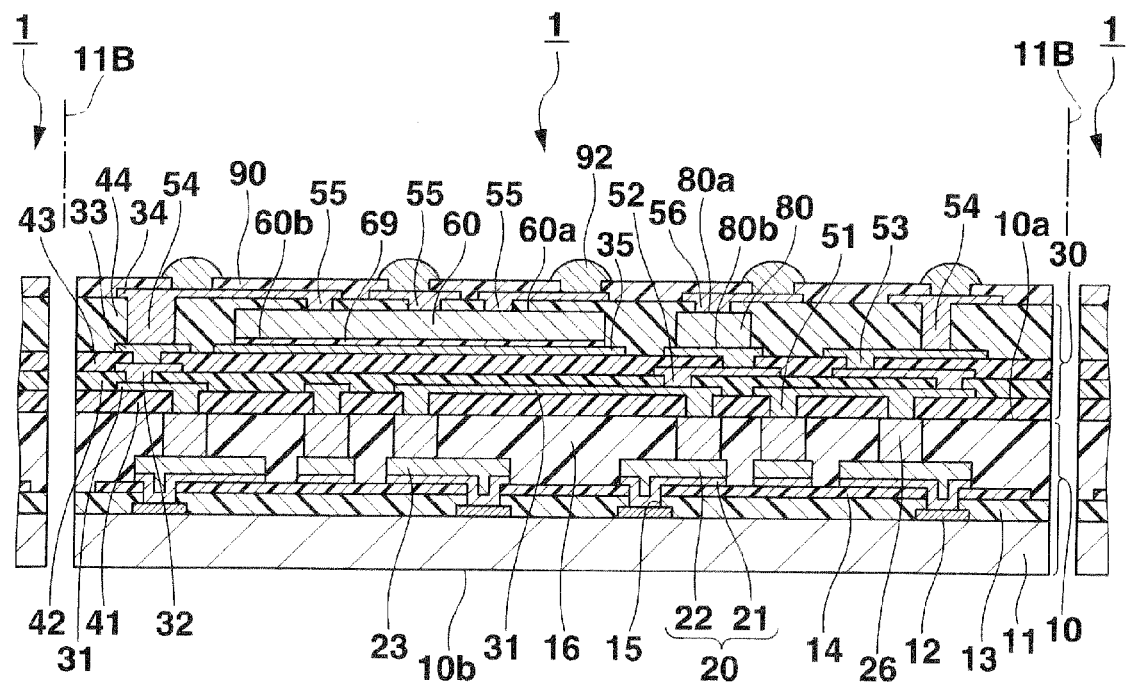
FIG. 19 is a cross-sectional view in a step after the step in FIG. 18.

Next, as shown in FIG. 19, the semiconductor wafer 11A, the sealing layer 16, the multilayer wiring structure 30 and the overcoat layer 90 are cut in the grid shape along the dicing street 11B, whereby the semiconductor wafer 11A, the sealing layer 16, the multilayer wiring structure 30 and the overcoat layer 90 are cut to the chip size. In such a way, the plurality of semiconductor devices 1 are completed. Those obtained by dividing the semiconductor wafer 11A are such semiconductor substrates 11.

Note that, before the cut-in-piece process, preferably, the semiconductor wafer 11A is thinned by grinding the back surface of the semiconductor wafer 11A concerned. Preferably, the grinding of the semiconductor wafer 11A is performed after the sealing layer 16 is formed.

As described above, before the semiconductor wafer 11A is cut, the packaging (the formation of the sealing layer 16), the formation of the multilayer wiring structure 30 and the embedding of the electronic components 60 and 80 are performed. Thereafter, the semiconductor wafer 11A is cut to the chip size. Accordingly, the size of the semiconductor device 1 can be matched with the size of the semiconductor chip 10. Therefore, the semiconductor device 1 can be miniaturized. Moreover, the multilayer wiring structure 30 is not stacked on a wafer other than the semiconductor wafer 11A on which the circuit is formed, but the multilayer wiring structure 30 is stacked on the semiconductor wafer 11A. Accordingly, the wafer other than the semiconductor wafer 11A is not required. Therefore, the thinning of the semiconductor device 1 can be achieved.

Modification Example

Note that embodiments to which the present invention is applicable are not limited to the above-mentioned embodiment, and are appropriately changeable within the scope without departing from the spirit of the present invention.

Figure 20:
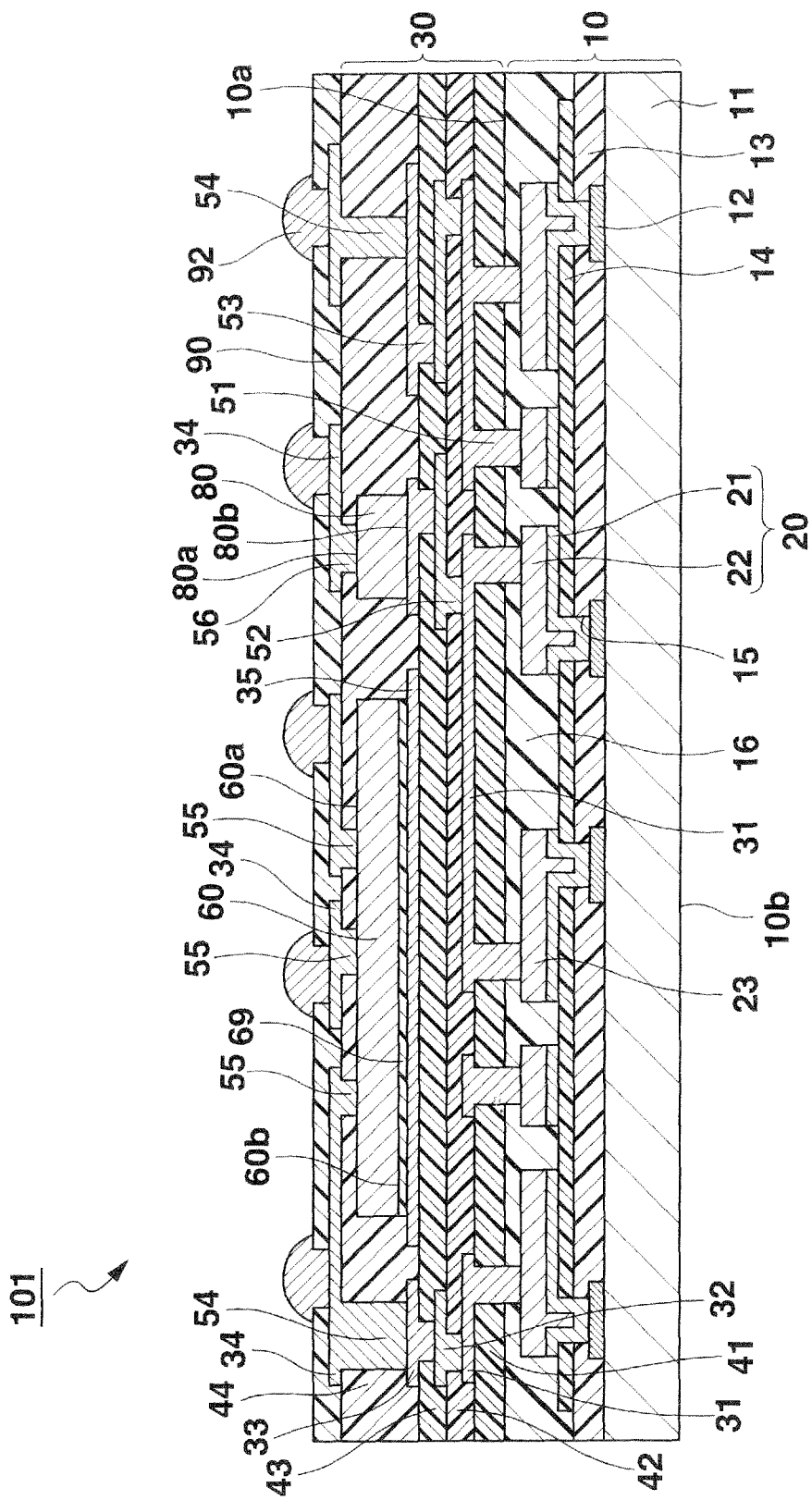
FIG. 20 is a cross-sectional view of a semiconductor device according to a modification example.

For example, there may be adopted a configuration like a semiconductor device 101 as shown in FIG. 20. The same reference numerals are assigned to portions which correspond to each other between the semiconductor device 101 shown in FIG. 20 and the semiconductor device 1 shown in FIG. 2.

As shown in FIG. 20, the outer terminals are not formed in the semiconductor chip 10, and the sealing layer 16 is thinned more than in the case shown in FIG. 2. The vias formed in the insulating layer 41 are opened to the sealing layer 16, and the interlayer connection conductors 51 penetrate the insulating layer 41 and the sealing layer 16, and are connected to the internal wires 20.

Except for those described above, the portions which correspond to each other between the semiconductor device 101 shown in FIG. 20 and the semiconductor device 1 shown in FIG. 2 are provided in a similar way to each other.

A method for manufacturing the semiconductor device 101 shown in FIG. 20 is substantially similar to the method for manufacturing the semiconductor device 1 shown in FIG. 2. However, the modification example is different from the first embodiment in that, in the event of manufacturing the semiconductor chip 10, the sealing layer 16 is formed without forming the outer terminals, and the vias serving for the interlayer connection conductors 51 are formed in the sealing layer 16 by irradiation of a laser beam.

What is claimed is:

1. A semiconductor device comprising:
   a semiconductor chip comprising:
      a semiconductor substrate;
      an integrated circuit, a plurality of terminals, and a passivation film provided on an upper surface of the semiconductor substrate; and
      a resin sealing layer formed on the passivation film so as to coat the upper surface of the semiconductor substrate;
   a multilayer wiring structure stacked on the semiconductor chip; and
   an electronic component embedded in the multilayer wiring structure;
   wherein the multilayer wiring structure has a plurality of insulating layers and a plurality of layers of wiring patterns which are stacked on each other in an alternating manner on the semiconductor chip inside an outer edge of the semiconductor chip as viewed from above;
   wherein the multilayer wiring structure further includes an interlayer connection conductor which is provided in an insulating layer from among the plurality of insulating layers so as to penetrate the insulating layer;
   wherein all of the plurality of layers of wiring patterns, the interlayer connection conductor, and the electronic component are located inside the outer edge of the semiconductor chip as viewed from above; and
   wherein the plurality of insulating layers include an insulating layer formed by curing prepreg.

2. The semiconductor device according to claim 1, wherein the multilayer wiring structure includes, in a lowest layer, an insulating layer covering the resin sealing layer.

3. The semiconductor device according to claim 1, wherein:
   the plurality of insulating layers include a first insulating layer in which a lateral surface of the electronic component is embedded;
   the first insulating layer is an insulating layer formed by curing prepreg; and
   a wiring pattern is directly formed on the first insulating layer.

4. The semiconductor device according to claim 1, wherein the resin sealing layer is a light-shielding layer.

5. The semiconductor device according to claim 1, wherein the resin sealing layer is formed by curing prepreg, and an upper surface of the resin sealing layer is formed to be flat.

6. The semiconductor device according to claim 3, wherein the wiring pattern formed on the first insulating layer and the interlayer connection conductor, which is formed in a via in the first insulating layer, are integrally formed by growing a conductor film on the first insulating layer or in the via.

7. The semiconductor device according to claim 3, wherein:
   the electronic component is a semiconductor chip comprising a semiconductor substrate, an integrated circuit, a passivation film formed on an upper surface of the semiconductor substrate, and an outer terminal;
   the first insulating layer covers the outer terminal; and
   a plurality of laser vias are formed in the first insulating layer, a first one of the laser vias being formed so as to correspond to the outer terminal of the electronic component to which the wiring pattern is connected, and a second one of the laser vias being formed so as to receive the interlayer connection conductor.

8. A semiconductor device comprising:
   a semiconductor chip comprising:
      a semiconductor substrate; and
      an integrated circuit, a plurality of terminals, and a passivation film provided on an upper surface of the semiconductor substrate;
   a multilayer wiring structure stacked on the semiconductor chip; and
   an electronic component embedded in the multilayer wiring structure;
   wherein the multilayer wiring structure has a plurality of insulating layers and a plurality of layers of wiring patterns which are stacked on each other in an alternating manner on the semiconductor chip inside an outer edge of the semiconductor chip as viewed from above;
   wherein the multilayer wiring structure further includes an interlayer connection conductor which is provided in an insulating layer from among the plurality of insulating layers so as to penetrate the insulating layer;
   wherein all of the plurality of layers of wiring patterns, the interlayer connection conductor, and the electronic component are located inside the outer edge of the semiconductor chip as viewed from above; and
   wherein the plurality of insulating layers include:
      at least one first insulating layer in which a lateral surface of the electronic component is embedded; and a second insulating layer which is formed by curing prepreg, the second insulating layer being formed at a position lower than a position of a lowest one of the at least one first insulating layer.

9. The semiconductor device according to claim 8, wherein among the plurality of layers of wiring patterns, a wiring pattern which is formed as a layer lower than the electronic component is covered with the second insulating layer, and the electronic component is disposed on a portion covering the wiring pattern.

10. The semiconductor device according to claim 8, wherein an entire exposed surface excluding a connection part of a wiring pattern which is formed in a same layer as a lower wiring pattern is covered with the second insulating layer.

11. The semiconductor device according to claim 8, wherein the second insulating layer comprises one of fiber-reinforced resin, glass-cloth resin, and carbon-cloth resin.

12. The semiconductor device according to claim 8, wherein among the plurality of insulating layers, the first insulating layer is also an insulating layer formed by curing prepreg, and a wiring pattern is directly formed on the first insulating layer.

13. The semiconductor device according to claim 12, wherein the wiring pattern formed on the first insulating layer and the interlayer connection conductor, which is formed in a via in the first insulating layer, are integrally formed by growing a conductor film on the first insulating layer or in the via.

14. A semiconductor device comprising:
a semiconductor chip comprising:
a semiconductor substrate; and
an integrated circuit, a plurality of terminals, and a passivation film provided on an upper surface of the semiconductor substrate;
a multilayer wiring structure stacked on the semiconductor chip; and
an electronic component embedded in the multilayer wiring structure;
wherein the multilayer wiring structure has a plurality of insulating layers and a plurality of layers of wiring patterns which are stacked on each other in an alternating manner on the semiconductor chip inside an outer edge of the semiconductor chip as viewed from above;
wherein the multilayer wiring structure further includes an interlayer connection conductor which is provided in an insulating layer from among the plurality of insulating layers so as to penetrate the insulating layer;
wherein all of the plurality of layers of wiring patterns, the interlayer connection conductor, and the electronic component are located inside the outer edge of the semiconductor chip as viewed from above;
wherein the plurality of insulating layers include a first insulating layer in which a lateral surface of the electronic component is embedded;
wherein the first insulating layer is an insulating layer formed by curing prepreg; and
wherein a wiring pattern is formed on the first insulating layer.

15. The semiconductor device according to claim 14, wherein the wiring pattern formed on the first insulating layer and the interlayer connection conductor, which is formed in a via in the first insulating layer, are integrally formed by growing a conductor film on the first insulating layer or in the via.

16. The semiconductor device according to claim 14, wherein:
the electronic component includes an outer terminal, and the first insulating layer covers the outer terminal; and
a plurality of laser vias are formed in the first insulating layer, a first one of the laser vias being formed so as to correspond to the outer terminal of the electronic component to which the wiring pattern is connected, and a second one of the laser vias being formed so as to receive the interlayer connection conductor.

17. The semiconductor device according to claim 14, further comprising another electronic component which has a different shape from a shape of the electronic component and which is embedded in the first insulating layer.

18. The semiconductor device according to claim 8, wherein:
the electronic component includes an outer terminal, and the first insulating layer covers the outer terminal, and
a plurality of laser vias are formed in the first insulating layer, a first one of the laser vias being formed so as to correspond to the outer terminal of the electronic component to which the wiring pattern is connected, and a second one of the laser vias being formed so as to receive the interlayer connection conductor.

19. The semiconductor device according to claim 8, further comprising another electronic component which has a different shape from a shape of the electronic component and which is embedded in the first insulating layer.

* * * * *